(12) United States Patent
Marsh et al.

(10) Patent No.: US 7,288,794 B2
(45) Date of Patent: Oct. 30, 2007

(54) INTEGRATED OPTICAL DEVICE

(75) Inventors: John Haig Marsh, Glasgow (GB); Simon Eric Hicks, Paisley (GB); James Stewart Aitchison, Toronto (CA); Stewart Duncan McDougall, Hazelbank (GB); Bo Cang Qiu, Glasgow (GB)

(73) Assignee: The University Court of the University of Glasgow, Glasgow (GB)

( * ) Notice: Subject to any disclaimer, the term of this patent is extended or adjusted under 35 U.S.C. 154(b) by 10 days.

(21) Appl. No.: 10/203,241

(22) PCT Filed: Jan. 31, 2001

(86) PCT No.: PCT/GB01/00409

§ 371 (c)(1),
(2), (4) Date: Dec. 9, 2002

(87) PCT Pub. No.: WO01/57565

PCT Pub. Date: Aug. 9, 2001

(65) Prior Publication Data

US 2003/0141511 A1 Jul. 31, 2003

(30) Foreign Application Priority Data

Feb. 7, 2000 (GB) .................................. 0002775.5

(51) Int. Cl.
*H01L 27/15* (2006.01)
*H01L 31/12* (2006.01)
*H01L 33/00* (2006.01)

(52) U.S. Cl. ............................. 257/80; 257/81; 257/82; 257/83; 257/84

(58) Field of Classification Search ............ 257/80–84; 372/46, 50, 43, 45
See application file for complete search history.

(56) References Cited

U.S. PATENT DOCUMENTS

| 4,420,219 | A | * | 12/1983 | Muchel ........................ 385/74 |
| 4,994,139 | A | * | 2/1991 | Biermann et al. ............ 438/27 |
| 5,615,224 | A | * | 3/1997 | Cohen .......................... 372/36 |
| 5,862,168 | A | | 1/1999 | Schilling et al. .............. 372/50 |
| 6,795,622 | B2 | * | 9/2004 | Forrest et al. ................ 385/50 |

OTHER PUBLICATIONS

Hofstetter et al. Ridge waveguide DBR laser with non-absorbing grating and a transparent integrated waveguide, Electronic Letters, Jun. 8, 1995, vol. 31 No. 12, pp. 980-982).*

(Continued)

*Primary Examiner*—Sara Crane
*Assistant Examiner*—Samuel A. Gebremariam
(74) *Attorney, Agent, or Firm*—McCarter & English, LLP

(57) ABSTRACT

An improved integrated optical device (5a-5g) is disclosed containing first and second devices (10a-10g; 15a, 15e), optically coupled to each other and formed in first and second different material systems. One of the first or second devices (10a-10g, 15a, 15e) has a Quantum Well Intermixed (QWI) region (20a, 20g) at or adjacent a coupling region between the first and second devices (10a-10g; 15a, 15e). The first material system may be a III-V semiconductor based on Gallium Arsenide (GaAs) or Indium Phosphide (InP), while the second material may be Silica ($SiO_2$), Silicon (Si), Lithium Niobate ($LiNbO_3$), a polymer, or glass.

38 Claims, 4 Drawing Sheets

OTHER PUBLICATIONS

IEEE Journal of Selected Topics in Quantum Electronics, vol. 3, No. 6, Dec. 1997; "*Tapered Rib Adiabatic Following Fiber Couplers in Etched GaAs Materials for Monolithic Spot-Size Transformation*", Vawter, G. Allen et al., pp. 1361-1371.

IEEE Photonics Technology Letters, vol. 9, No. 9, Sep. 1997; "*Improvements in Mode-Locked Semiconductor Diode Lasers Using Monolithically Integrated Passive Waveguides Made by Quantum-Well Intermixing*", Camacho, F. et al., pp. 1208-1210.

Department of Electronics and Electrical Engineering, University of Glasgow, Glasgow, Scotland; "*Increased Power Operation of GaAS/AIGaAs Waveguide p-l-n Photodiodes with Non-Absorbing Input Facets, Fabricated by Quantum Well Intermixing*", McDougall, S.D. et al., pp. 810-811.

* cited by examiner

INTEGRATED OPTICAL DEVICE

FIELD OF INVENTION

This invention relates to an improved integrated optical device or optoelectronic device, and particularly to hybrid integration of devices formed in different material systems. For example, hybrid integration of III-V semiconductor devices with passive waveguide structures.

BACKGROUND TO INVENTION

Hybrid integration of III-V semiconductor components with passive waveguides is of increasing importance as a method of increasing the functionality of integrated optical and photonic systems. Applications include: optical communication systems, optical sensing applications, and optical data processing.

A fundamental problem in hybrid integration is that the semiconductor element has a higher refractive index than the passive waveguide. In the case of a III-V semiconductor component integrated on a planar Silica ($SiO_2$) platform, the refractive indices are typically around 3.6 for the semiconductor and 1.5 for the Silica. This refractive index difference causes a number of problems, e.g. there is a high reflection coefficient at the interface between the two devices, and the mode size in each device is different. Both of these effects result in a loss in optical power, reduced coupling efficiency between the two devices, and scattering of light, and undesirable reflections.

It is an object of the present invention to obviate or at least mitigate one or more of the aforementioned problems in the prior art.

Further objects of various embodiments of the present invention include:

enablement of hybrid integration to be carried out, while ensuring good mode matching between active and passive sections;

ease of manufacture;

low loss coupling between active and passive sections.

SUMMARY OF INVENTION

According to a first aspect of the present invention there is provided an integrated optical device including first and second devices optically coupled one to the other and formed in first and second different material systems, at least one of the first or second devices having a Quantum Well Intermixed (QWI) region at or adjacent a coupling region between the first and second devices.

Quantum Well Intermixing (QWI) permits a postgrowth modification to the absorption edge of Multiple-Quantum Well (MQW) material, and therefore provides a flexible, reliable, simple, and low-cost approach compared to competing integration schemes such as selective area epitaxy or selective etching and regrowth.

Quantum Well Intermixing (QWI) provides a means of tuning an absorption band edge controllably in Quantum Well (QW) structures, and may be utilized to fabricate low-loss optical interconnects between monolithically integrated optical devices or integrated optoelectronic devices.

The first material system may be a III-V semiconductor material system. The III-V semiconductor material may be selected from or include one or more of: Gallium Arsenide (GaAs), Aluminium Gallium Arsenide (AlGaAs), Indium Phosphide (InP), Gallium Arsenide Phosphide (GaAsP), Aluminium Gallium Arsenide Phosphide (AlGaAsP), Indium Gallium Arsenide Phosphide (InGaAsP), or the like.

The second material system may be a non III-V semiconductor material. The second material system may be selected from: Silica ($SiO_2$), Silicon (Si), Lithium Niobate ($LiNbO_3$), a polymer, a glass, or the like, any of which may be doped with optically active material.

The first device may be or include an active device component, such as a laser diode, light emitting diode (LED), optical modulator, optical amplifier, optical switch, or switching element, optical detector (eg photodiode), or the like. The first device may also include a passive device compound such as a passive waveguide.

The second device may be, or include a passive component such as a passive waveguide.

Preferably, the coupling region provides means for at least substantially mode matching between the first and second devices.

In one arrangement the first device provides the Quantum Well Intermixed (QWI) region.

In the one arrangement the mode matching means may comprise a waveguide provided in the first device which waveguide may be a "tapered" waveguide providing a linear change in width, a non-linear change in width, and/or a "periodic" or "a-periodic" segmentation.

Preferably, the coupling region provides anti-reflection means at or near an interface between the first and second devices.

The anti-reflection means may comprise or include an anti-reflection coating on a facet of the first device provided at the interface between the first and second devices.

The anti-reflection means may also comprise or include facets of the first and second devices provided at the interface between the first and second devices, the facets being formed at an (acute) angle to an intended direction of optical transmission. The facets may therefore be referred to as "angled facets".

In a preferred embodiment a first waveguide section in the first device and preferably also a second waveguide section in the second device is/are bent.

The integrated optical device may be adapted to operate in a wavelength region of about 600 to 1300 nm or of about 1200 to 1700 nm.

According to a second aspect of the present invention, there is provided an integrated optical circuit, optoelectronic integrated circuit, or photonic integrated circuit including at least one integrated optical device according to the first aspect of the present invention.

According to a third aspect of the present invention there is provided an apparatus including at least one integrated optical device, the at least one integrated optical device providing first and second devices optically coupled one to the other and formed in first and second different material systems, one of the first or second devices having a Quantum Well Intermixed (QWI) region at or adjacent a coupling region between the first and second devices.

According to a fourth aspect of the present invention there is provided a method of providing an integrated optical device having hybrid integration of first and second devices formed in first and second different material systems comprising:

providing one of the first or second devices with a Quantum Well Intermixed (QWI) region at or adjacent a coupling region between the first and second devices.

The Quantum Well Intermixed (QWI) region may be formed from a number of techniques, but preferably by a universal damage induced technique, Impurity Free Vacancy Diffusion (IFVD).

In a preferred embodiment, the Quantum Well Intermixed (QWI) region may be formed in the first device by intermixing a Quantum Well(s) (QW) in a core optical guiding layer of the first device, e.g. by Impurity Free Vacancy Diffusion (IFVD).

When performing IFVD, a dielectric, e.g. $SiO_2$ layer or film, may be deposited upon a top cap layer of the a III-V semiconductor material of the first device. Subsequent rapid thermal annealing of the semiconductor material causes bonds to break within the semiconductor alloy, e.g. Gallium ions or atoms which are susceptible to Silica ($SiO_2$), to dissolve into the Silica so as to leave vacancies in the cap layer. The vacancies then diffuse through the semiconductor material inducing layer intermixing, e.g. in the Quantum Well(s) (QW).

IFVD has been reported in "Quantitative Model for the Kinetics Of Compositional Intermixing in GaAs—AlGaAs Quantum—Confined Heterostructures," by Helmy et al, IEEE Journal of Selected Topics in Quantum Electronics, Vol. 4, No. 4, Jul./Aug. 1998, pp. 653-660, the content of which is incorporated herein by reference.

According to a fifth aspect of the present invention there is provided a first device according to the first aspect of the present invention.

BRIEF DESCRIPTION OF DRAWINGS

Embodiments of the present invention will now be described, by way of example only, and with reference to the accompanying diagrams, which are.

DETAILED DESCRIPTION

Figure 1A:
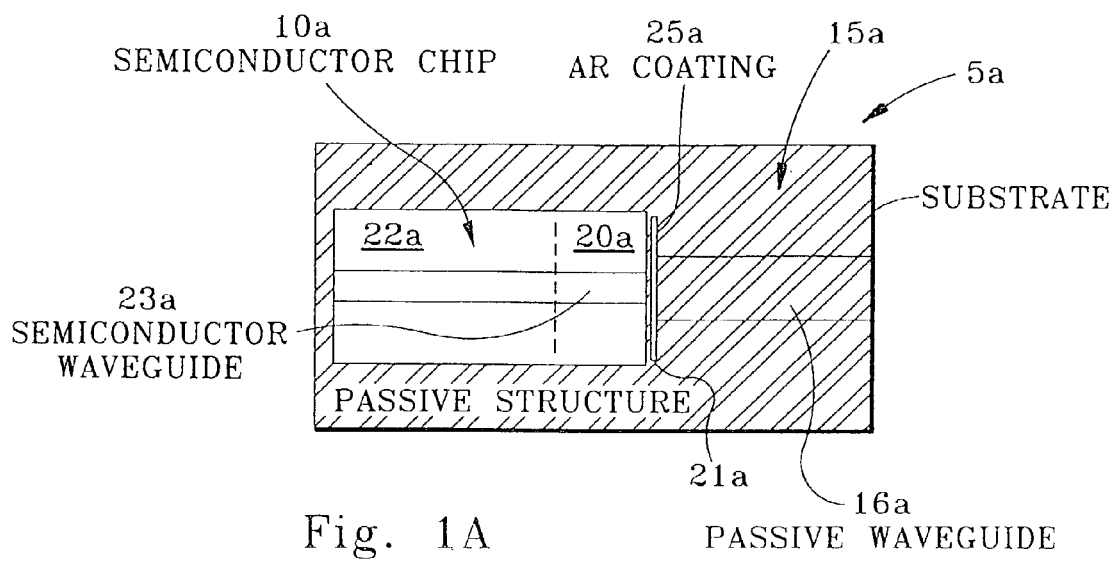
FIG. 1(a) a schematic plan view of a first semiconductor chip integrated with a passive photonic integrated circuit (PIC) according to a first embodiment of the present invention.

Referring initially to FIG. 1(a) there is illustrated an integrated optical device, generally designated 5a, according to a first embodiment of the present invention and providing the first and second devices 10a, 15a respectively, the first and second devices 10a, 15a being optically coupled one to the other and formed in first and second dis-similar material systems, at least one of the first or second devices 10a, 15a having a Quantum Well Intermixed (QWI) region 20a at or adjacent a coupling region 21a between the first and second devices 10a, 15a.

In this embodiment the first materials system is a III-V semiconductor material system based on either Gallium Arsenide (GaAs) or Indium Phosphide (InP). For example the III-V semiconductor material may be selected or include one or more of: Gallium Arsenide (GaAs), Aluminium Gallium Arsenide (AlGaAs), and Indium Phosphide (InP), Gallium Arsenide Phosphide (GaAsP), Aluminium Gallium Arsenide Phosphide (AlGaAsP), Indium Gallium Arsenide Phosphide (InGaAsP), or the like. The integrated optical device 5a may therefore be adapted to operate in the so-called "short" wavelength region of 600 to 1300 nm, or the so-called "long" wavelength region of 1200 to 1700 nm.

The second material system is a non III-V semiconductor material and can be selected from Silica ($SiO_2$), Silicon (Si), Lithium Niobate ($LiNbO_3$), a polymer, glass or the like.

The first device 10a comprises an active device component 22a, selected from a laser diode, light emitting diode (LED), optical modulator, optical amplifier, optical switching element, optical detector (eg photodiode), or the like. The active device component 22a is spaced from the Quantum Well Intermixed (QWI) region 20a, the active device component 22a, and passive QWI region 20a being in optical communication one with the other via a waveguide 23a such as a ridge waveguide.

The second device 15a in this embodiment includes a passive device component in the form of a passive waveguide 16a.

The coupling region 21a provides anti-reflection means at or near an interface between the first and second devices 10a, 15a. The anti-reflection means comprise anti-reflection coating 25a on an end facet on first device 10a provided at the interface between the first and second devices 10a, 15a.

In a modification the anti-reflection means may also comprise facets of the first and second devices 10a, 15a provided at the interface between the first and second devices 10a, 15a, the facets being formed at an acute angle to the intended direction of the optical transmission along waveguides 23a, 16a. In such a modification the facets may be referred to as "angled facets".

Figure 1B:
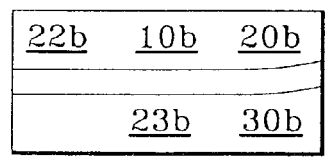
FIGS. 1(b)-(d) schematic plan views of second, third and fourth semiconductor chips integratable with a passive photonic integrated circuit (PIC) similar to or the same as that of FIG. 1(a) according to the present invention.

Referring now to FIG. 1(b) there is illustrated a second embodiment of a first device 10b comprising part of an optically integrated device according to the present invention, like parts of the device 10b being identified by the same numerals as those for the first embodiment, but suffixed "b". In this second embodiment the waveguide 23b includes a curved portion 30b so as to improve optical coupling between the first device 10b and a second device (not shown), by reduction of reflections at the interface between the first device 10b and the second device.

Figure 1C:
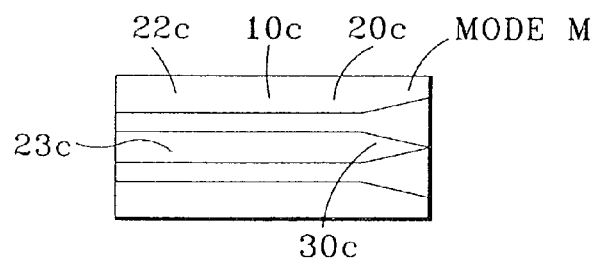

Referring now to FIG. 1(c), there is illustrated a third embodiment of a first device, generally designated 10c, which may be a part of an optically integrated device according to an embodiment of a present invention. The device 10c is similar to the device 10a of the first embodiment, and like parts are identified by like numerals, but suffixed "c". However, as can be seen from FIG. 1(c), the waveguide 23c includes at an end adjacent the coupling region to the second device (not shown) a tapered region 30c which, in use, causes an optical mode "M" transmitted along the waveguide 23c to expand as it traverses the optical waveguide 23c and is output from the first device 10c from the tapered region 30c. The converse of course applies for optical coupling to the first device 10c from the second device (not shown).

Figure 1D:
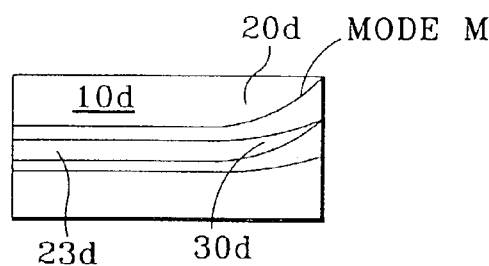

Referring now to FIG. 1(d), there is shown a fourth embodiment of a first device 10d comprising part of an optically integrated device according to an embodiment of the present invention. The first device 10d is substantially similar to the device 10a of the first embodiment, like parts being identified by like numerals but suffixed "d". However, in the first device 10d, the waveguide 23d includes at an end adjacent a coupling region to a second device (not shown) a curved and tapered region 30d. The first device 10d therefore combines the features of the embodiments of FIGS. 1(b) and (c).

It will be appreciated that in order to control electronically the first devices 10a-10d, an electrical contact (metallization) will be fabricated on a surface of the waveguide 23a-23d, while a further electrical contact (metallization) will be provided on an opposing surface of the device 10a-10d.

It will be appreciated that the modifications shown in the second, third and fourth embodiments 10b, 10c, 10d, seek to improve optical coupling between the first device 10b, 10c, 10d, and a second device (not shown).

It will also be appreciated that the intermixed region 20a to 20b acts to prevent, or at least reduce, optical absorption in the intermixed region 20a-20d adjacent to the coupling region 21a-21d. This is particularly so in the curved tapered waveguide section 30b.

It will further be appreciated that although herein above the waveguide sections 30c and 30d have been referred to as "tapered" regions, the optical mode transmitted therein towards an end of the first device 10c to 10d adjacent to second device (not shown) actually flares.

Figure 2A:
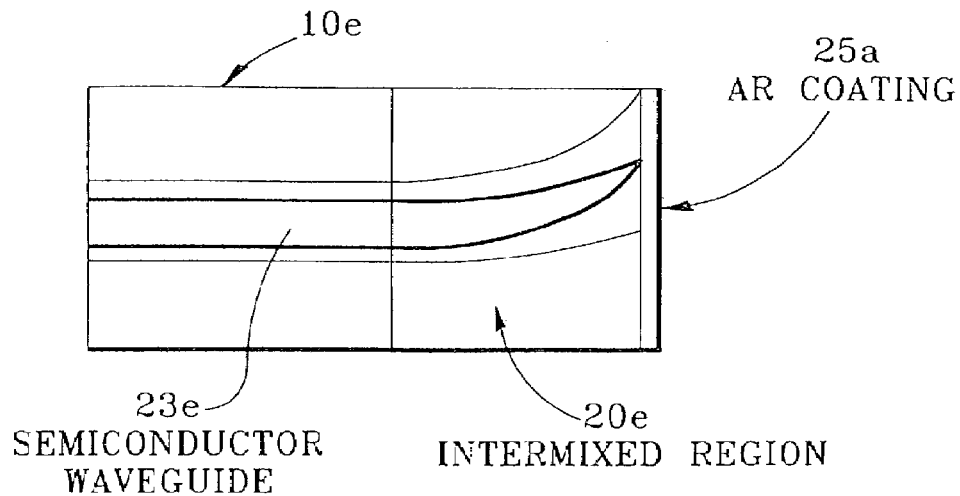
FIG. 2(a) a schematic plan view of a fifth semiconductor chip according to the present invention.
Figure 2B:
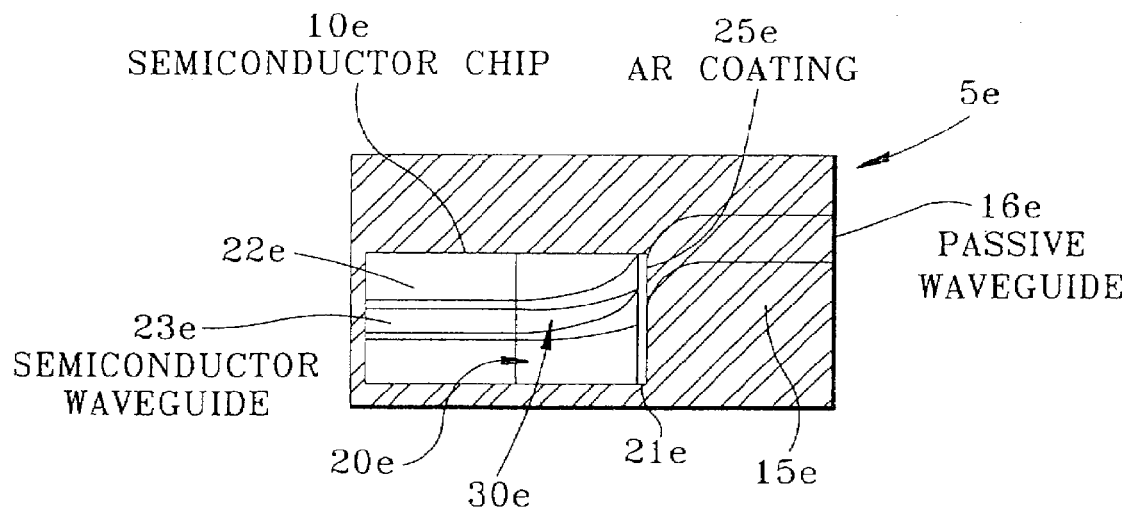
FIG. 2(b) a schematic plan view of the fifth semiconductor chip of FIG. 2(a) integrated with a passive photonic integrated circuit (PIC) according to a fifth embodiment of the present invention.

Referring now to FIGS. 2(a) and (b), there is illustrated an integrated optical device generally designated 5e, according to a fifth embodiment of the present invention. The device 5e provides first and second devices 10e, 15e optically coupled one to the other and formed in first and second different material systems, the first device 10e having a Quantum Well Intermixed (QWI) region 20e adjacent a coupling region 21e between the first and second device 10e, 15e. As can be seen from FIGS. 2(a) and (b) a waveguide 23e of the first device 10e comprises a tapered curved region 30e adjacent a coupling region 21e between the first and second devices 10e, 15e. Further, an anti-reflection coating 25e is provided within the coupling region 21e on an end facet of the first device 10e. Also, a passive waveguide 16e of the second device 15e is complementarily curved to the portion 30e so as to also assist in optical coupling between the first and second devices 10e, 15e.

Figure 3:
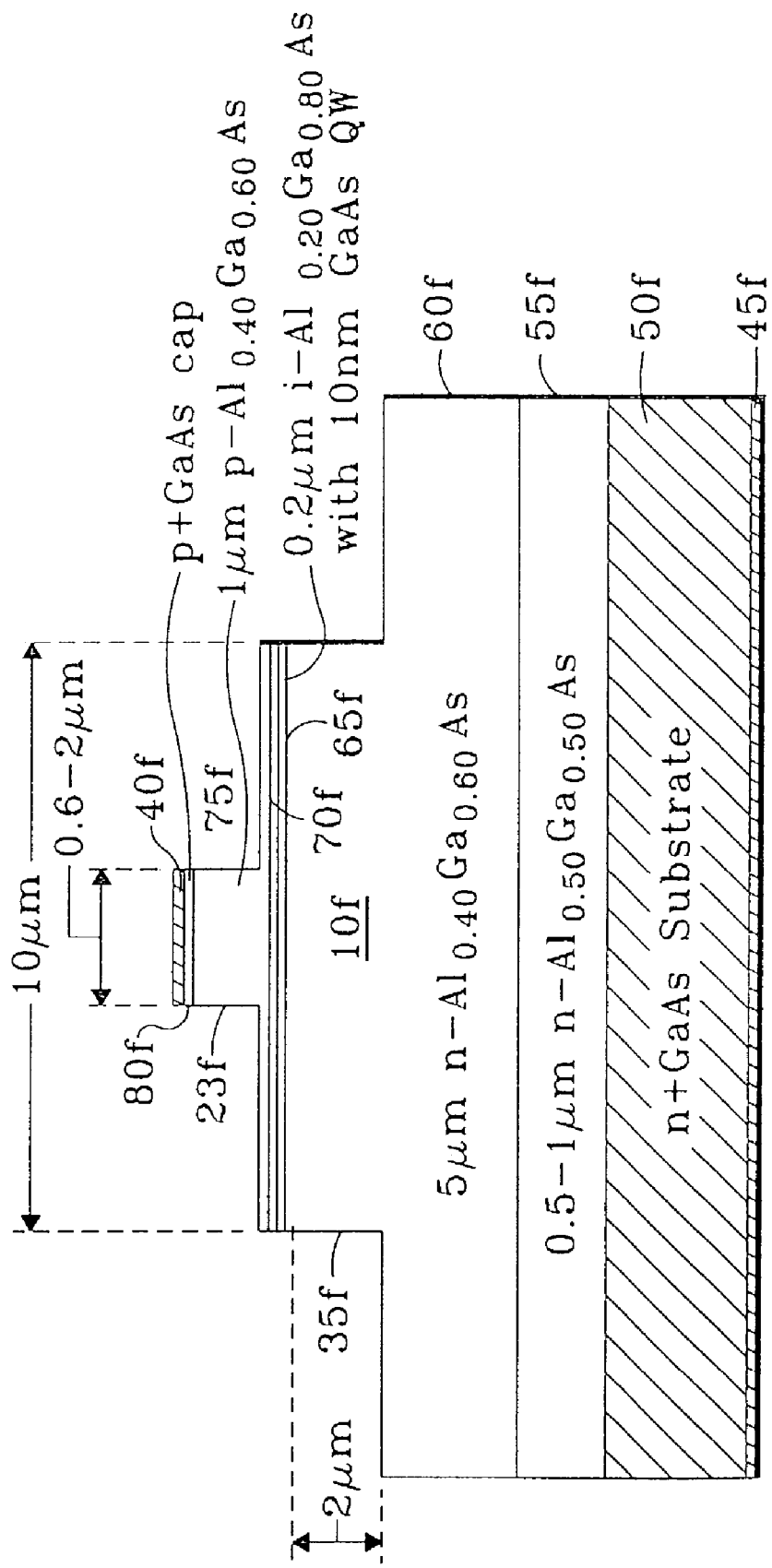
FIG. 3 a schematic cross-sectional end view showing a possible layer structure of a semiconductor chip according to a sixth embodiment of the present invention.
Figure 4:
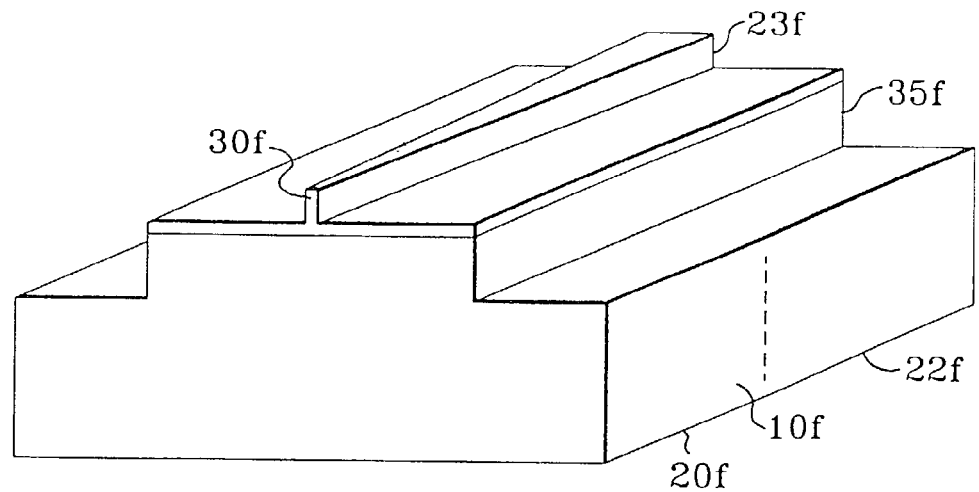
FIG. 4 a schematic perspective view from one end, above and to one side of the semiconductor chip of FIG. 3.

Referring now to FIGS. 3 and 4, there is illustrated a sixth embodiment of a first device generally designated 10f according to the present invention. Like parts of the device 10f are identified by the same numerals as for the device 10a of the first embodiment of FIG. 1(a), but suffixed "f."

The device 10f comprises a GaAs substrate 50f, upon which are grown a number of epitaxial layers by known growth techniques such as Molecular Beam Epitaxy (MBE) or Metal Organic Chemical Vapour Deposition (MOCVD). The layers comprise a first 0.51 µm to 1 µm n-doped $Al_{0.50}Ga_{0.50}As$ layer 55f, a second 5 µm n-doped $Al_{0.40}Ga_{0.60}As$ layer 60f, a third 0.5 µm substantially intrinsic $Al_{0.20}Ga_{0.80}As$ core layer, including a 10 nm GaAs Quantum Well (QW), 70f as grown. On the core layer 65f is grown a 1 µm p-doped $Al_{0.40}Ga_{0.60}As$ layer 75f, and finally on that layer is grown a p+ doped GaAs capping contact layer 80f. As can be seen from FIG. 3, a ridge waveguide 23f is formed in the layers 75f, 80f by known photolithographic techniques. Further in this embodiment, a second broader ridge or mesa 35f is also formed in the layers 65f and 60f. Thus the ridge waveguide 23f comprises a primary waveguide while the mesa 35f comprises a secondary waveguide. The device 10f also includes a tapered region 30f on the waveguide 23f. The device 10f, therefore, acts as a mode converter converting a mode from the device 10f coupled to a second device (not shown), or a mode transmitted from the second device to the first device 10f.

As can be seen from FIG. 3, contact metallisations 40f and 45f may be provided on a top of ridge 23f and an opposing surface of the substrate 50f. Further, as can be seen from FIG. 4, the device 10f includes a Quantum Well Intermixed (QWI) region 20f adjacent to the end of the device corresponding to the tapered region 30f.

In this embodiment the Quantum Well Intermixed (QWI) region 20f is formed in the first device 10f by intermixing the Quantum Well 70f in the layer 60f within the region 20f by Impurity Free Vacancy Diffuision (IFVD). When performing IFVD upon a top cap layer 80f of the III-V semiconductor material comprising the first device 10f, there is deposited a dielectric, e.g. Silica ($SiO_2$), layer of film. Subsequent rapid thermal healing of the semiconductor material causes bonds to break within the semiconductor alloy and e.g. Gallium ions or atoms—which are susceptible to Silica ($SiO_2$)—to dissolve into the Silica so as to leave vacancies in the cap layer 80f. The vacancies then diffuse through the semiconductor material inducing layer intermixing, e.g. in the Quantum Well 70f.

Figure 5:
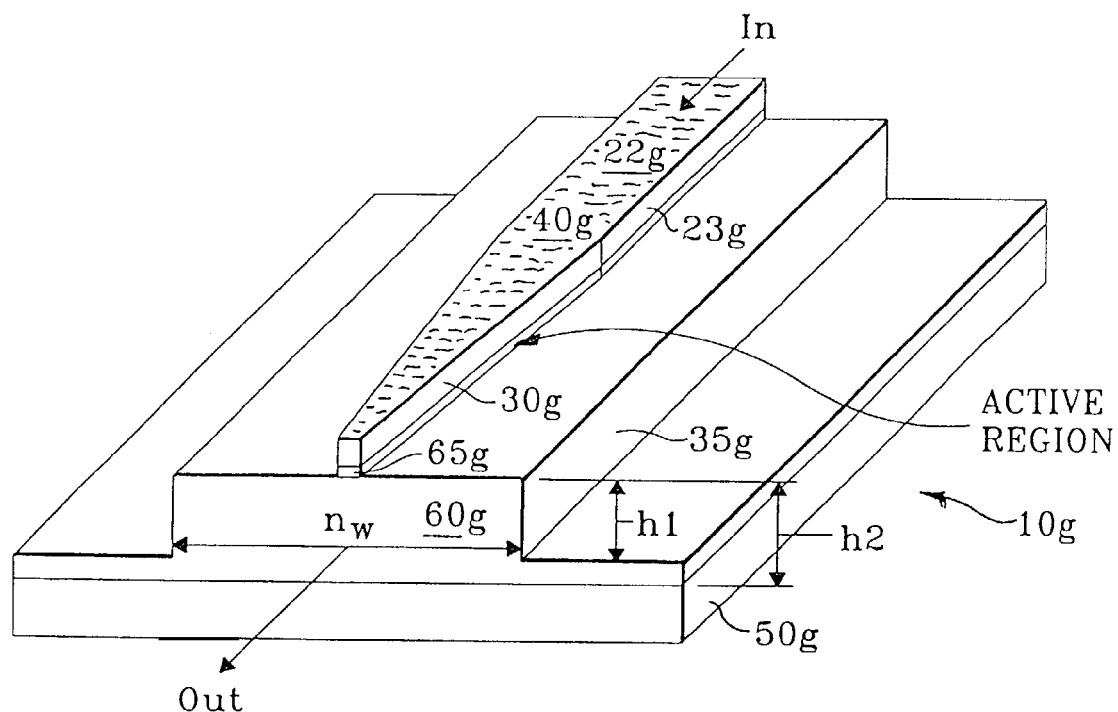
FIG. 5 a schematic perspective view from one end, above and to one side of a semiconductor chip according to a seventh embodiment of the present invention.

Referring now to FIG. 5 and to Table 1, there is illustrated a seventh embodiment of a first device generally designated 10g, for use in an optically integrated device according to the present invention. In this sixth embodiment, the first device 10g is fabricated in Indium Gallium Arsenide Phosphide (In $In_{1-x}Ga_x As_y P_{1-y}$).

The layer structure, grown on an Indium Phosphide (InP) substrate 50g, is shown in Table 1 below.

TABLE I

| Repeats | Thickness (A) | Material | x | y | Dopant | Type |
|---|---|---|---|---|---|---|
| 1 | 1000 | In(x)GaAs | 0.53 | | Zn | p |
| 1 | 500 | Q1/18 | | | Zn | p |
| 1 | 11500 | InP | | | | p |
| 1 | 50 | Q1.05 | | | | i |
| 1 | 2500 | InP | | | | |
| 1 | 800 | Q1.1 | | | | i |
| 1 | 500 | Ql.8 | | | | i |
| 5* | 120 | Q1.26 | | | | i |
| 5* | 65 | In(x)GaAs | 0.53 | | | i |
| 1 | 120 | Q1.26 | | | | i |
| 1 | 500 | Q1.18 | | | | i |
| 1 | 800 | Q1.1 | | | | i |
| 1 | 50000 | Q1.05 | | | Si | n |
| 1 | 10000 | InP (buffer layer adjacent substate) | | | Si | n |

*Quantum Well (QW) structure
Q = Quaternary, e.g. Q1.1 = quaternary with 1.1 µm bandgap As can be seen from FIG. 5, the first device 10g includes an active waveguide 23g and adjacent to coupling region to a second device (not shown) a tapered region 30g. The waveguide 23g comprises a primary waveguide of the first device 10g, while a further ridge or mesa 35g formed on the device 10g comprises a secondary waveguide. In use, the optical radiation generated within or transmitted from the waveguide 23g towards the tapered region 30g as an optical mode, is caused upon transmission through region 30g from primary optical guiding layer 65g into layer 60g for optical coupling to second device (not shown).

The first devices 10f and 10g illustrate a design of regrowth-free tapered waveguide coupler. The small rib waveguide 23f, 23g is located on top of a thick lower cladding layer 60f, 60g that is partially etched to form mesa wave guide 35f, 35g. When the small rib 23f, 23g is sufficiently wide, the fundamental optical mode is confined to the small rib 23f, 23g, and there is a high confinement of light within the undoped waveguide core layer 65f, 65g (which itself contains the active Quantum Well layers, e.g. 75f in FIG. 3, or intermixed region 20f, 20g). At the other extreme, when the small rib 23f, 23g is sufficiently narrow, the fundamental mode expands to fill the larger mesa waveguide 35f, 35g. This behaviour is a consequence of the design of the waveguide layers. The thicknesses and compositions of the Quantum Well layers at the top of the mesa 35f, 35g, and extending under the small rib 23f, 23g are such as to prevent guiding of light within these layers if the upper layers comprising the small rib 23f, 23g are etched away. The resulting waveguide allows-separate optimisation of the optical mode properties of the rib 23f, 23g and mesa 35f, 35g waveguides at the two extremes of rib width. At large rib widths high-performance device action (such as optical amplification, optical detection, electro-absorptive or electro-refractive modulation) can be achieved. At small rib widths the dimensions of the large mesa 35f, 35g and thickness of the lower cladding materials establish the optical mode size of the mesa waveguide for optimum coupling to passive Silica waveguides. The expanded mode can be designed for optimum coupling directly to single mode waveguides in the second (non-semiconductor) material or to optical fibre, including 1.3 μm and 1.5 μm telecommunication fibre.

The layer structure shown in FIG. 3 would be used to make a first device 10f with Quantum Wells resonant with radiation at a wavelength of around 860 nm. The structure shown in FIG. 5 would be used to make a first device 10g with Quantum Wells resonant with radiation at a wavelength around 1.5 μm.

It will be appreciated that the embodiments of the invention hereinbefore described are given by way of example only, and are not meant to limit the scope thereof in any way.

It will he particularly understood that the device of the present invention is easier and simpler to manufacture than other devices, and therefore provides the potential of obtaining high quality devices at reduced cost.

It will also be appreciated that in the disclosed embodiments the mode matching means comprised a "tapered" waveguide providing a linear or non-linear change in width, in modified implementations the change in width may be "periodically" or "a-periodically" segmented. The expression "segmented waveguide" is intended to encompass any waveguide into which has been introduced a disturbance or variation in the refractive index of the waveguide along at least one dimension of the waveguide. The variation may be periodic or, more preferably, aperiodic. Preferably the variation is along the longitudinal axis of the waveguide. However, variations along the lateral axis, or even along an axis oblique to the longitudinal axis may be used.

It will further be understood that in this invention, Quantum Well Intermixing (QWI) is used to reduce absorption by the Quantum Well layers within the taper region and so reduce optical losses in the taper region and improve device efficiency.

Finally, it will be appreciated that in a modification the first device may be inverted with respect to the second device, i.e. the ridge waveguide of the first device may be in contact with, or adjacent, a surface of the second device.

What is claimed is:

1. An integrated optical device, comprising:
   a first device formed in a first material system, said first material system being a III-V semiconductor material; and
   a second device formed in a second material system, said second material system being other than a III-V semiconductor material;
   wherein said first device and said second device are optically coupled to each other so as to form an optical interface between said first device and second device, and wherein said first device defines a quantum well intermixed (QWI) re gion at or adjacent said optical interface that is effective to alter optical characteristics of light passing through the first device.

2. An integrated optical device according to claim 1, wherein said III-V semiconductor material includes at least one of: Gallium Arsenide (GaAs), Aluminum Gallium Arsenide (AlGaAs), Indium Phosphide (InP), Gallium Arsenide Phosphide (GaAsP), Aluminum Gallium Arsenide Phosphide (AlGaAsP), and Indium Gallium Arsenide Phosphide (InGaAsP).

3. An integrated optical device according to claim 1, wherein said second material system is other than a III-V semiconductor material.

4. An interated optical device according to claim 1, wherein said first refractive index is about 3.6, and said second refractive index is about 1.5.

5. An integrated optical device according to claim 1, wherein said second material system is selected from: Silica ($SiO_2$), Silicon (Si), Lithium Niobate ($NiNbO_3$), a polymer, and a glass.

6. An integrated optical device according to claim 1, wherein said second material system is doped with an optically active material.

7. An integrated optical device according to claim 1, wherein said first device includes an optically active device.

8. An integrated optical device according to claim 7, wherein said optically active device is one of a laser diode, a light emitting diode (LED), an optical modulator, an optical amplifier, an optical switch, and an optical detector.

9. An integrated optical device according to claim 1, wherein said second device includes an optically passive device.

10. An integrated optical device according to claim 9, wherein said optically passive device is a passive waveguide.

11. An integrated optical device according to claim 1, further comprising an anti-reflection means disposed at said optical interface.

12. An integrated optical device according to claim 11, wherein said first device includes a facet at said optical interface, and said anti-reflection means includes an anti-reflection coating on said facet.

13. An integrated optical device according to claim 11, wherein said first device and said second device are adapted to cooperate such that a first direction of optical transmission is established at said optical interface, and further wherein first device includes a facet at said optical interface, said second device includes a facet at said optical interface, and said anti-reflection means includes said respective facets of said first and second devices being formed at an acute angle to an said first direction of optical transmission.

14. An integrated optical device according to claim 1, wherein said first optical device includes a first waveguide adjacent said optical interface, said second optical device includes a second waveguide adjacent said optical interface, and said first and second waveguides include respective curved extents.

15. An integrated optical device according to claim 1, wherein said integrated optical device operates in a wavelength range of one of from about 600 nm to about 1300 nm, and from about 1200 nm to about 1700 nm.

16. An integrated optical device according to claim 1, wherein said first and second devices are formed on a common substrate.

17. An apparatus including at least one integrated optical device according to claim 1.

18. An apparatus in accordance with claim 17, wherein said apparatus is a circuit selected from an integrated optical circuit, an optoelectronic integrated circuit, and a photonic integrated circuit.

19. An integrated optical device, comprising:
a first device including a first material system, and
a second device including a second material system, said second material system being different from said first material system;
wherein said first device and said second device are optically coupled to each other so as to form an optical interface between said first device and second device, and wherein said first device further includes a coupling region adjacent said optical interface containing an intermixed quantum well, said quantum well intermixing (QWI) being effective to alter the optical characteristics of light passing through the first device in said coupling region so as to provide for substantial mode matching between said first and second devices.

20. An integrated optical device according to claim 19, wherein said first material system is a III-V semiconductor material.

21. An integrated optical device according to claim 20, wherein said III-V semiconductor material includes at least one of: Gallium Arsenide (GaAs), Aluminum Gallium Arsenide (AlGaAs), Indium Phosphide (InP), Gallium Arsenide Phosphide (GaAsP), Aluminum Gallium Arsenide Phosphide (AlGaAsP), and Indium Gallium Arsenide Phosphide (InGaAsP).

22. An integrated optical device according to claim 19, wherein said second material system is other than a III-V semiconductor material.

23. An integrated optical device according to claim 19, wherein said second material system is selected from: Silica ($SiO_2$), Silicon (Si), Lithium Niobate ($NiNbO_3$), a polymer, and a glass.

24. An integrated optical device according to claim 19, wherein said second material system is doped with an optically active material.

25. An integrated optical device according to claim 19, wherein said first device includes an optically active device.

26. An integrated optical device according to claim 25, wherein said optically active device is one of a laser diode, a light emitting diode (LED), an optical modulator, an optical amplifier, an optical switch, and an optical detector.

27. An integrated optical device according to claim 19, wherein said second device includes an optically passive device.

28. An integrated optical device according to claim 27, wherein said optically passive device is a passive waveguide.

29. An integrated optical device according to claim 19, wherein said coupling region includes a waveguide provided in said first device, said waveguide being tapered so as to provide at least one of: a linear change in width, a non-linear change in width, a periodic segmentation, and an a-periodic segmentation.

30. An integrated optical device according to claim 19, further comprising an anti-reflection means disposed at said optical interface.

31. An integrated optical device according to claim 30, wherein said first device includes a facet at said optical interface, and said anti-reflection means includes an anti-reflection coating on said facet.

32. An integrated optical device according to claim 30, wherein said first device and said second device are adapted to cooperate such that a first direction of optical transmission is established at said optical interface, and further wherein first device includes a facet at said optical interface, said second device includes a facet at said optical interface, and said anti-reflection means includes said respective facets of said first and second devices being formed at an acute angle to an said first direction of optical transmission.

33. An integrated optical device according to claim 19, wherein said first optical device includes a first waveguide adjacent said optical interface, said second optical device includes a second waveguide adjacent said optical interface, and said first and second waveguides include respective curved extents.

34. An integrated optical device according to claim 19, wherein said integrated optical device operates in a wavelength range of one of from about 600 nm to about 1300 nm, and from about 1200 nm to about 1700 nm.

35. An integrated optical device according to claim 19, wherein said first and second devices are formed on a common substrate.

36. An integrated optical device according to claim 19, wherein said first material systems has a refractive index of about 3.6, and said second material system has a refractive index of about 1.5.

37. An apparatus including at least one integrated optical device according to claim 19.

38. An apparatus in accordance with claim 37, wherein said apparatus is a circuit selected from an integrated optical circuit, an optoelectronic integrated circuit, and a photonic integrated circuit.

* * * * *